United States Patent
Prasher

(10) Patent No.: US 6,751,837 B2
(45) Date of Patent: Jun. 22, 2004

(54) METHOD OF HEAT EXTRACTION FROM AN INTEGRATED CIRCUIT DIE

(75) Inventor: Ravi Prasher, Phoenix, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/025,434

(22) Filed: Dec. 18, 2001

(65) Prior Publication Data

US 2002/0051343 A1 May 2, 2002

Related U.S. Application Data

(62) Division of application No. 09/606,893, filed on Jun. 29, 2000, now Pat. No. 6,351,387.

(51) Int. Cl.[7] .......................... B21D 39/03; H05K 3/00; H05K 7/20; H01R 43/00
(52) U.S. Cl. ............................. 29/428; 29/829; 29/825; 361/707
(58) Field of Search .......................... 29/428, 436, 458, 29/469, 592.1, 825, 829; 361/707, 719; 174/252; 428/210

(56) References Cited

U.S. PATENT DOCUMENTS

| | | | |
|---|---|---|---|
| 4,640,010 A | * | 2/1987 | Brown ...................... 174/16.3 |
| 5,073,840 A | | 12/1991 | Coors ......................... 361/400 |
| 5,761,038 A | | 6/1998 | Tanaka ....................... 361/700 |
| 5,769,158 A | | 6/1998 | Yao ............................ 165/185 |
| 5,917,157 A | | 6/1999 | Remsburg .................. 174/252 |
| 5,931,222 A | | 8/1999 | Toy et al. .................. 165/80.3 |
| 5,945,203 A | | 8/1999 | Soane ........................ 428/209 |
| 5,950,072 A | * | 9/1999 | Queyssac .................... 438/106 |
| 6,037,044 A | | 3/2000 | Giri et al. ................... 428/209 |
| 6,114,005 A | | 9/2000 | Nagai et al. ................ 428/114 |
| 6,159,586 A | | 12/2000 | Inoue et al. ................ 428/209 |
| 6,362,530 B1 | * | 3/2002 | Lee et al. ................... 257/704 |
| 6,391,442 B1 | * | 5/2002 | Duvall et al. ............... 427/218 |

FOREIGN PATENT DOCUMENTS

JP          405326743    * 12/1993

* cited by examiner

Primary Examiner—John C. Hong
(74) Attorney, Agent, or Firm—Schwegman, Lundberg, Woessner & Kluth, P.A.

(57) ABSTRACT

A heat dissipation system and method for extracting heat from an integrated circuit die includes attaching an integrated circuit die to a heat extraction substrate capable of extracting heat from the integrated circuit die. Further, a heat transport medium is attached to the heat extraction substrate, to transport the extracted heat from the heat extraction substrate to ambient. In some embodiments, the heat dissipation device can further include a heat sink, attached to the heat transport medium, to further facilitate the transporting of the heat from the heat transport medium to ambient.

19 Claims, 5 Drawing Sheets

METHOD OF HEAT EXTRACTION FROM AN INTEGRATED CIRCUIT DIE

This application is a divisional of application U.S. Ser. No. 09/606,893, filed on Jun. 29, 2000, now U.S. Pat. No. 6,351,387.

TECHNICAL FIELD

Embodiments of this invention relate generally to a heat dissipation system and method for an integrated circuit assembly, and more particularly to a system and method of dissipating heat from an integrated circuit die.

BACKGROUND

Integrated circuit devices, microprocessors and other related computer components are becoming more and more powerful with increasing capabilities, resulting in increasing amounts of heat generated from these components. Packaged units and integrated circuit die sizes of these components are decreasing or remaining the same, which increases the amount of heat energy given off by the components for a given unit of surface area. Furthermore, as computer related equipment becomes more powerful, more and more components are being placed inside the equipment which is also decreasing in size, resulting in additional heat generation in a smaller volume of space. Increased temperatures can potentially damage the components of the equipment, or reduce the lifetime of the individual components and the equipment. Therefore, large amounts of heat produced by many such integrated circuits must be dissipated, and therefore must be accounted for in designing the integrated circuit mounting and packaging devices.

In current packaging techniques, heat sinks are typically applied to the side (back side) of the integrated circuit opposite the side (front side) from which the electrical pin connections are mounted. As such, the heat sink is oriented extending away from a printed circuit board to which the integrated circuit is mounted. Therefore, generally all of the heat has to be extracted from the back side of the integrated circuit die. There is generally a limitation on the amount of heat that can be extracted from the back side of the integrated circuit die, because of the thermal resistance induced by the thermal interface materials (such as a silicon die, a heat pipe to transport heat from the die to the heat sink, and any thermal grease or adhesives) used between the back side of the integrated circuit die and the heat sink. Generally, to increase heat extraction through the back side of the die requires increasing the volume of the heat sink (this generally means increasing the stack height of the heat sink to dissipate more heat). The overall size of the heat sink is generally limited by the volume constraints of the housing. For example, some mobile products such as lap-top computers and ultra-mobile computers require very small stack heights.

For the reasons stated above, and for other reasons stated below which will become apparent to those skilled in the art upon reading and understanding the present specification, there is a need in the art for an enhanced heat dissipation system that does not require increasing the stack height of the heat sink for dissipating the heat generated by the integrated circuit die.

DETAILED DESCRIPTION

Figure 1:
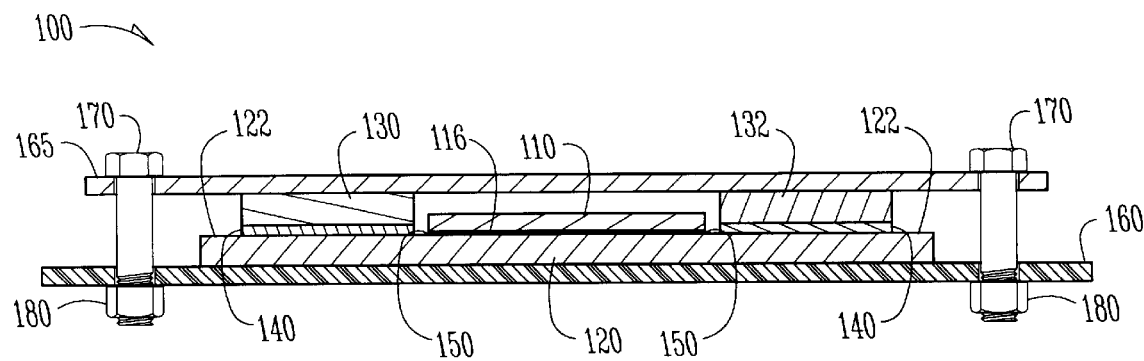
FIG. 1 is a front sectional view of one embodiment of a heat dissipation device according to an embodiment of the present invention.

In the following detailed description of the embodiments, reference is made to the accompanying drawings that illustrate embodiments of the present invention and their practice. In the drawings, like numerals describe substantially similar components throughout the several views. These embodiments are described in sufficient detail to enable those skilled in the art to practice them. Other embodiments may be utilized, and structural, logical, and electrical changes may be made without departing from the scope of the present disclosure. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the embodiments of the present invention are defined only by the appended claims, along with the full scope of equivalents to which such claims are entitled.

This document describes, among other things, a heat dissipation system and method for extracting heat from an integrated circuit die, without increasing stack height of a thermal solution to dissipate the heat generated by the integrated circuit die. The foregoing is achieved by attaching a heat extraction substrate made of a composite material to extract heat away from a front side of the integrated circuit die, as set forth in detail below.

FIG. 1 shows a front sectional view of a heat dissipation device 100 according to an embodiment of the present invention. Shown in FIG. 1 is an integrated circuit die 110 attached to a heat extraction substrate 120. In this embodiment, a front side 116 of the integrated circuit die 110 is attached to the heat extraction substrate 120. The heat extraction substrate 120 extends laterally around and away from the integrated circuit die 110 to form a laterally extending heat dissipation region 122. The front side 116 of the integrated circuit die 110 includes integrated circuitry and electrical pin connections. Generally, the front side 116 including the integrated circuitry and the electrical pin connections is where the heat is mostly generated. In this embodiment, integrated circuit die 110 is a microprocessor.

In this embodiment, heat extraction substrate 120 is made of an Organic Land Grid Array (OLGA) material. OLGA material is a composite material made of multiple layers of conductive material such as copper and an organic material. In this example embodiment, the multiple layers of copper are embedded inside the organic material, to provide the electrical coupling between the integrated circuitry on the front side of the integrated circuit die 110 and a motherboard. OLGA material has a very high thermal conductivity in the lateral direction compared to the thickness direction, because the copper layers are very thin (when compared to the thickness of the organic material) and extend laterally in the substrate material. Copper has a very high thermal conductivity of nearly 400 watts/meter Kelvin compared to the thermal conductivity of the organic (insulating) material, which is of the order of 1 watt/meter Kelvin. Therefore, OLGA material has a high thermal conductivity in the lateral direction versus the thickness direction. This high thermal conductivity of OLGA material in the lateral direction is what is used in embodiments of the present invention to extract heat away from the front side of the integrated circuit die 110. The thermal conductivity of OLGA material is approximately in the range of about 3 watts/meter Kelvin to 10 watts/meter Kelvin in the thickness direction, and 60 watts/meter Kelvin to 100 watts/meter Kelvin in the lateral direction.

Also shown in FIG. 1, is a thermally conductive interface material 150 used to attach the integrated circuit die 110 to the heat extraction substrate 120. The thermally conductive interface material 150 provides the necessary thermal coupling between the integrated circuit die 110 and the heat extraction substrate 120 to dissipate the heat.

FIG. 1 also shows a heat transport medium 130 associated with heat extraction substrate 120 to dissipate the extracted heat from heat extraction substrate 120 to ambient. For example, heat transport medium 130 can be a liquid, a thermo-siphon, a direct impingment cooling medium, a heat sink and/or one or more heat pipes.

In this example embodiment, the heat pipes 130 (made by Thermacore Inc. Lancaster, Pa.) are used to transport heat from the integrated circuit die 110 to a heat sink. The heat pipes 130 are generally made from copper tubing including a wicking structure inside the copper tubing. Copper tubing is partially filled with a fluid such as water. At the region of thermal interface, between the integrated circuit die 110 and the heat pipes 130, thermal energy from the integrated circuit die 110 is transferred to the heat pipes, and the transferred thermal energy excites the fluid in the copper tubing. Such excitation vaporizes the fluid from a liquid state to a gaseous state. The gaseous fluid by means of the wicking structure travels to a heat sink and transfers the thermal energy to the heat sink. After transferring the thermal energy, the gaseous fluid condenses back to a liquid state, and the condensed liquid travels back to the region of thermal interface.

In this embodiment, FIG. 1 shows two heat pipes 130 and 132 attached to the laterally extending heat dissipation region 122 of the heat extraction substrate 120 for transporting the heat from the heat extraction substrate 120. The two heat pipes 130 and 132 are attached to the heat extraction substrate 120 such that they are on the same side as the integrated circuit die 110 and on the laterally extending heat dissipation region 122, and further they are disposed across from each other. By attaching the two heat pipes 130 and 132 to the heat extraction substrate 120 such that they are disposed on the same side and across from each other, the two heat pipes 130 and 132 are acting in parallel, and the thermal resistance at the junctions (where the two heat pipes 130 and 132 are attached to the heat extraction substrate 120) is significantly reduced when compared with the thermal resistance developed when using only one heat pipe.

The two heat pipes 130 and 132 are attached to the heat extraction substrate 120 using a thermally conductive interface material 140 to provide the necessary thermal coupling between the heat extraction substrate 120 and the two heat pipes 130 and 132. The thermally conductive interface material 140 can be a thermally conductive adhesive, a thermal grease, a phase change metallic filled polymeric material, an elastomer, a gel, a metallic foil, a metallic paste and/or a solder.

FIG. 1 also shows a printed circuit board 160 attached to the heat extraction substrate 120. In one embodiment printed circuit board 160 can be a motherboard of a computer. In this embodiment, a clamping device is used to exert a sufficient downward force to thermally couple the heat extraction substrate 120 with the heat pipes 130 and 132. In this example embodiment, FIG. 1 shows the clamping device including a clamping plate 165, and one or more clamping bolts and nuts 170 and 180 to hold the heat extraction substrate 120 and the heat pipes 130 and 132 in place, and also to provide the necessary compressive force to thermally couple the heat extraction substrate 120 with the heat pipes 130 and 132.

Figure 2:
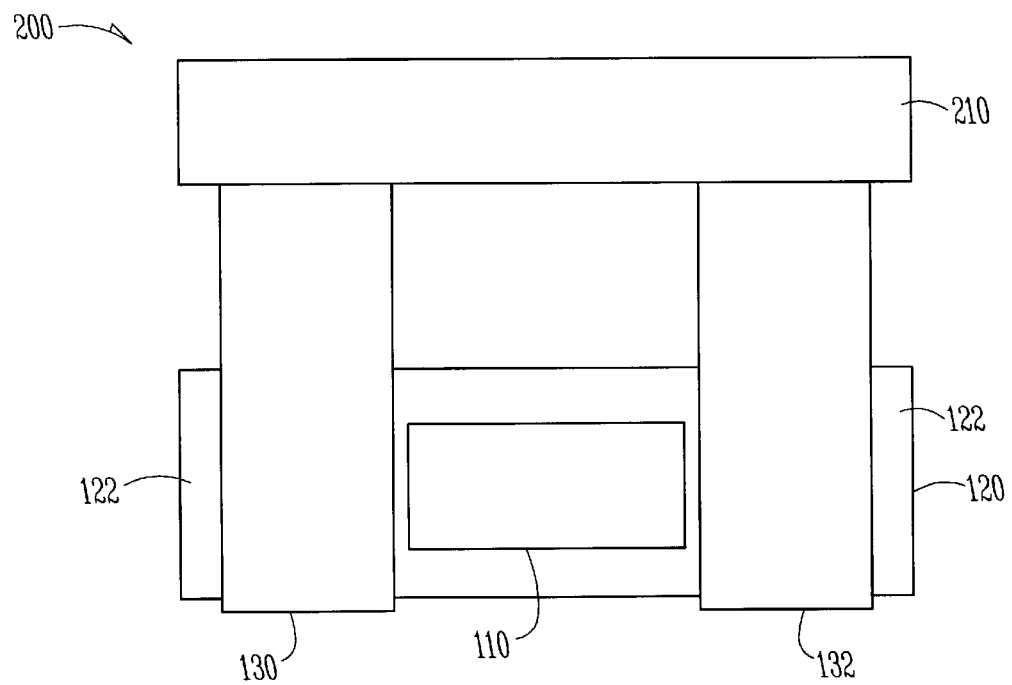
FIG. 2 is a top view of the heat dissipation device shown in FIG. 1.

FIG. 2 is a top view 200 of the device 100 shown in FIG. 1. In addition to what is shown in FIG. 1, FIG. 2 shows a heat sink 210 thermally coupled to the heat transport medium 130 and 132. In this embodiment, the heat sink 210 further facilitates in dissipating the transported heat from the heat pipes 130 and 132 to ambient. Even after using the heat sink 210, to further facilitate dissipating the heat from the integrated circuit die 110, the stack height of the thermal solution provided by this embodiment remains low.

Figure 3:
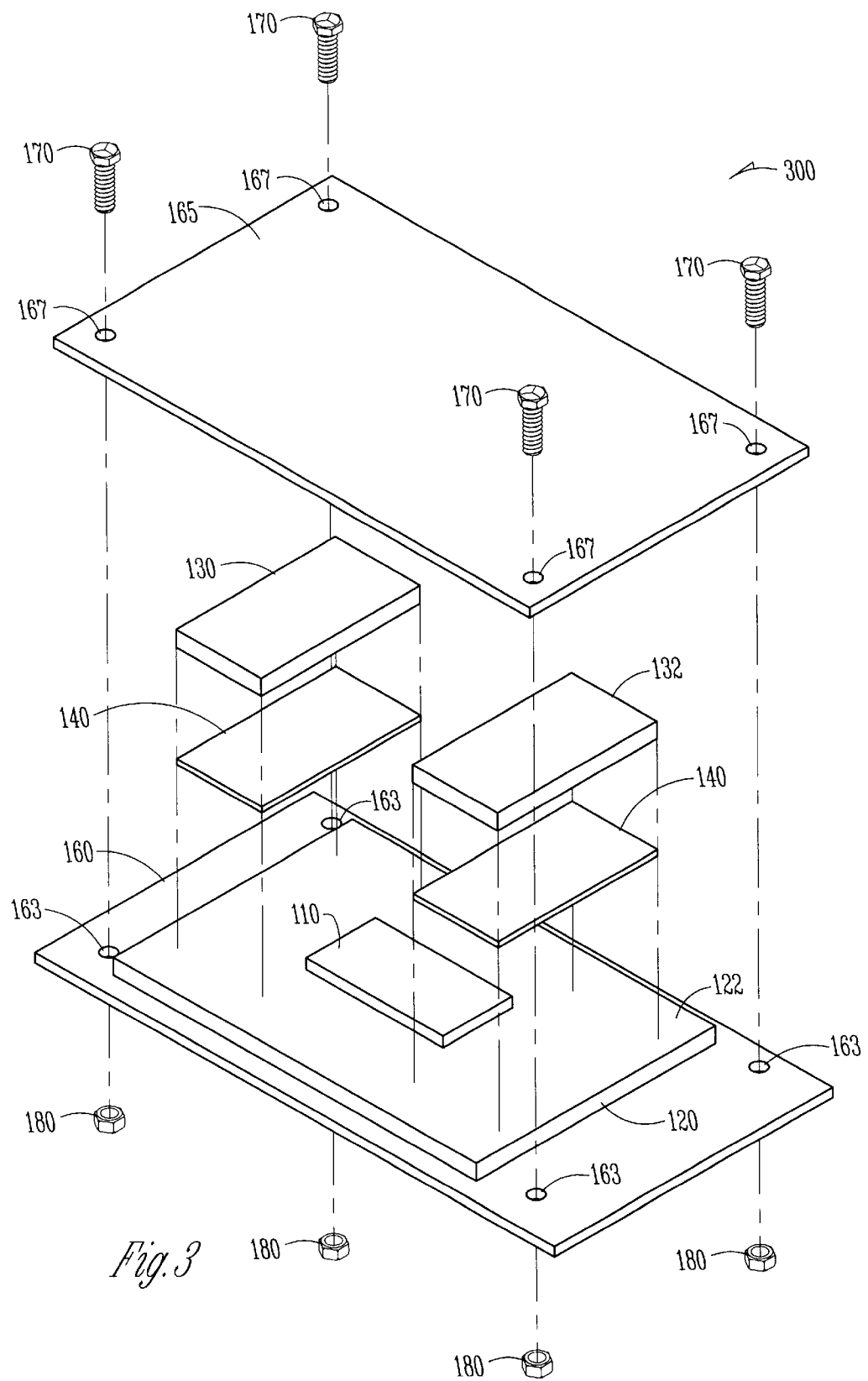
FIG. 3 is an exploded view of the heat dissipation device shown in FIGS. 1 and 2.

FIG. 3 is an exploded view 300 of the device 100 shown in FIGS. 1 and 2. Shown in FIG. 3 are the integrated circuit die 110 attached to the heat extraction substrate 120. Also shown in FIG. 3 is the laterally extending heat dissipation region 122. In this embodiment, the front side 116 (see FIG. 1) of the integrated circuit die 110 is attached to the heat extraction substrate 120 (generally, the front side 116 of the integrated circuit die 110 including the integrated circuitry and external pin connections is where most of the heat is generated). Extracting heat from the front side 116 of the integrated circuit die 110 is more efficient than extracting heat from a back side; because, the heat generated on the front side of an integrated circuit die does not have to travel through the integrated circuit die (silicon die) to get to the back side of the integrated circuit die to dissipate heat. Thus, the thermal resistance of the silicon die will not be a factor when extracting heat from the front side 116 of the integrated circuit die 110.

The printed circuit board 160 is attached to the heat extraction substrate 120 such that the integrated circuit die 110 is disposed across from the printed circuit board 160. FIG. 3 also shows two heat pipes 130 and 132, and the thermally conductive interface material 140 used to couple the heat pipes 130 and 132 to the laterally extending heat dissipation region 122 of the heat extraction substrate 120 to transport the heat from the heat extraction substrate 120 to ambient. Also shown in FIG. 3 is the clamping device including a clamping plate 165, and one or more bolts and nuts 170 and 180 to clamp and hold the two heat pipes 130 and 132 and the heat extraction substrate 120 through the plurality of holes 167 and 163 in the printed circuit board 160 and clamping plate 165, respectively. Also, the clamping device provides a necessary compressive force to thermally couple the two heat pipes 130 and 132 to the heat extraction substrate 120.

Figure 4:
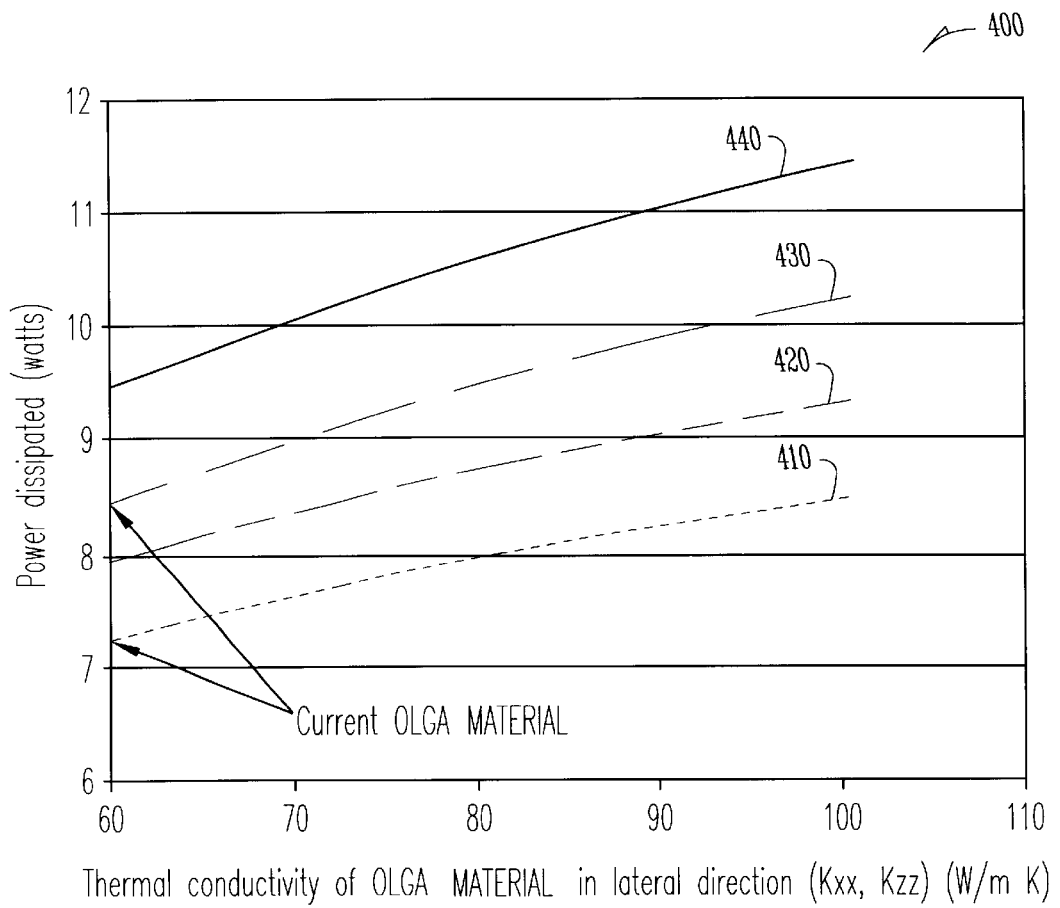
FIG. 4 is a graph illustrating the thermal conductivity of the heat dissipation device shown in FIGS. 1 and 2.

FIG. 4 is a graph 400 illustrating heat dissipation characteristics of the heat extraction substrate 120 when using OLGA material as the substrate material for the heat extraction substrate 120. FIG. 4 shows that current OLGA material, which has a thermal conductivity of 60 watts/meter Kelvin in the lateral direction and a thermal conductivity of 3 watts/meter Kelvin in the thickness direction, can dissipate over 7 watts of power when using a heat sink having a thermal resistance of 2° C./watt to dissipate the transported heat (graph 410), and can dissipate nearly 8.0 watts of power when using a heat sink having a thermal resistance of 1° C./watt to dissipate the transported heat (graph 420). FIG. 4 also shows that OLGA material having a thermal conductivity of 60 watts/meter Kelvin in the lateral direction, and a thermal conductivity of 5 watts/meter Kelvin in the thickness direction, can dissipate nearly 8.5 watts of power when using a heat sink having a thermal resistance of 2° C./watt to dissipate the transported heat (graph 430), and nearly 9.5 watts of power when using a heat sink having a thermal resistance of 1° C./watt to dissipate the transported heat (graph 440). Graphs 410, 420, 430 and 440 were generated using simulation to show the potential for significantly increasing the heat dissipation rates of OLGA material by increasing the thermal conductivity of the OLGA material in the lateral direction. Graphs 410, 420, 430 and 440 also show that the heat dissipated by OLGA material increases with the increased thermal conductivity of the OLGA material in the lateral direction.

Figure 5:
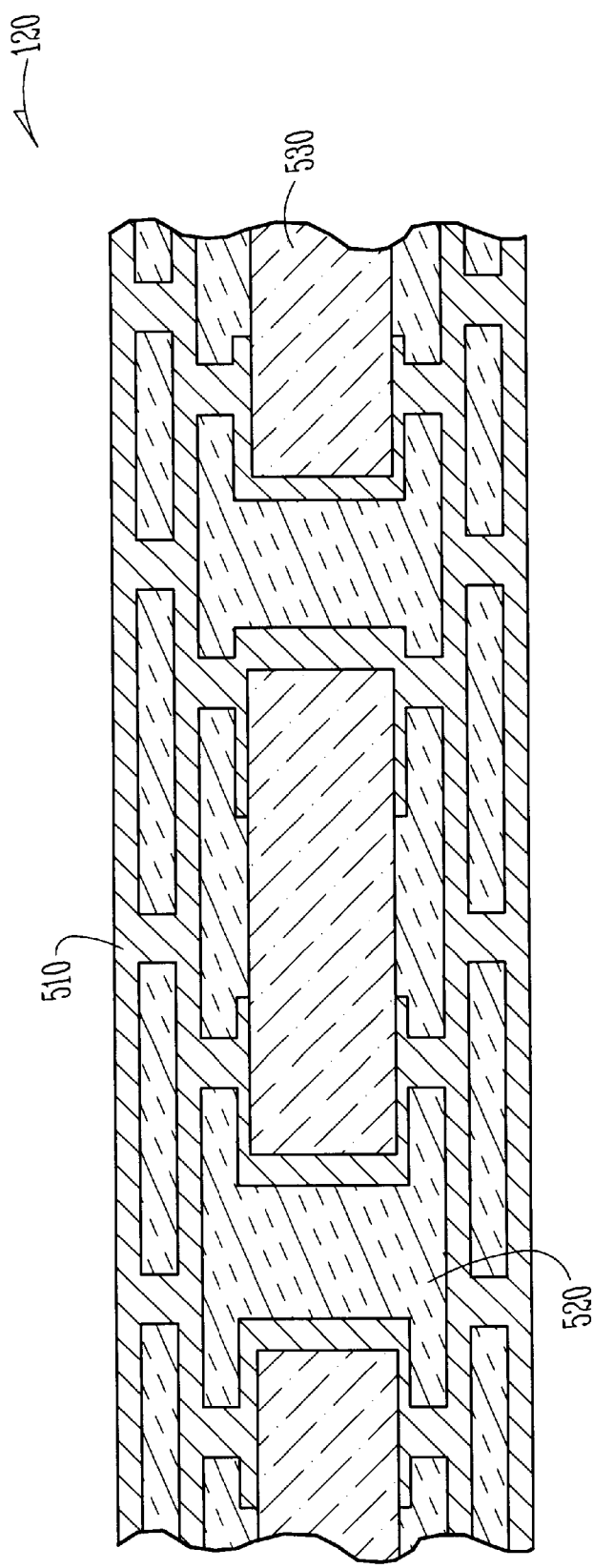
FIG. 5 is a front sectional view of one embodiment of the heat extraction substrate.

FIG. 5 is a front sectional view of one embodiment of the heat extraction substrate 120. In this embodiment shown in FIG. 5, the heat extraction substrate 120 is made of an Organic Land Grid Array (OLGA) material. OLGA material is a composite material made of multiple layers of a conductive material, such as copper 510 and insulating and organic materials 520 and 530, such as FR4 or Bismaleimide-Traizine Resin (BT). In this example embodiment, multiple layers of copper 510 are embedded inside and between the insulating and organic materials 520 and 530, to provide the electrical coupling between the integrated circuitry on the front side 116 (refer to FIG. 1) of the integrated circuit die 110 and printed circuit board 160.

The OLGA material shown in this embodiment has a very high thermal conductivity in the lateral direction compared to the thickness direction, because the copper layers 510 are very thin (when compared to the thickness of the organic material) and extend laterally in the heat extraction substrate material 120. Copper has a very high thermal conductivity of nearly 400 watts/meter Kelvin compared to the thermal conductivity of 1 watt/meter Kelvin for the organic and insulating materials used in OLGA material. Therefore, OLGA material has a high thermal conductivity in the lateral direction versus the thickness direction. This high thermal conductivity of OLGA material in the lateral direction is what is used in embodiments of the present invention to extract heat away from the front side 116 (refer to FIG. 1) of the integrated circuit die 110. The thermal conductivity of OLGA material is approximately in the range of about 3 watts/meter Kelvin to 10 watts/meter Kelvin in the thickness direction, and 60 watts/meter Kelvin to 100 watts/meter Kelvin in the lateral direction.

Figure 6:
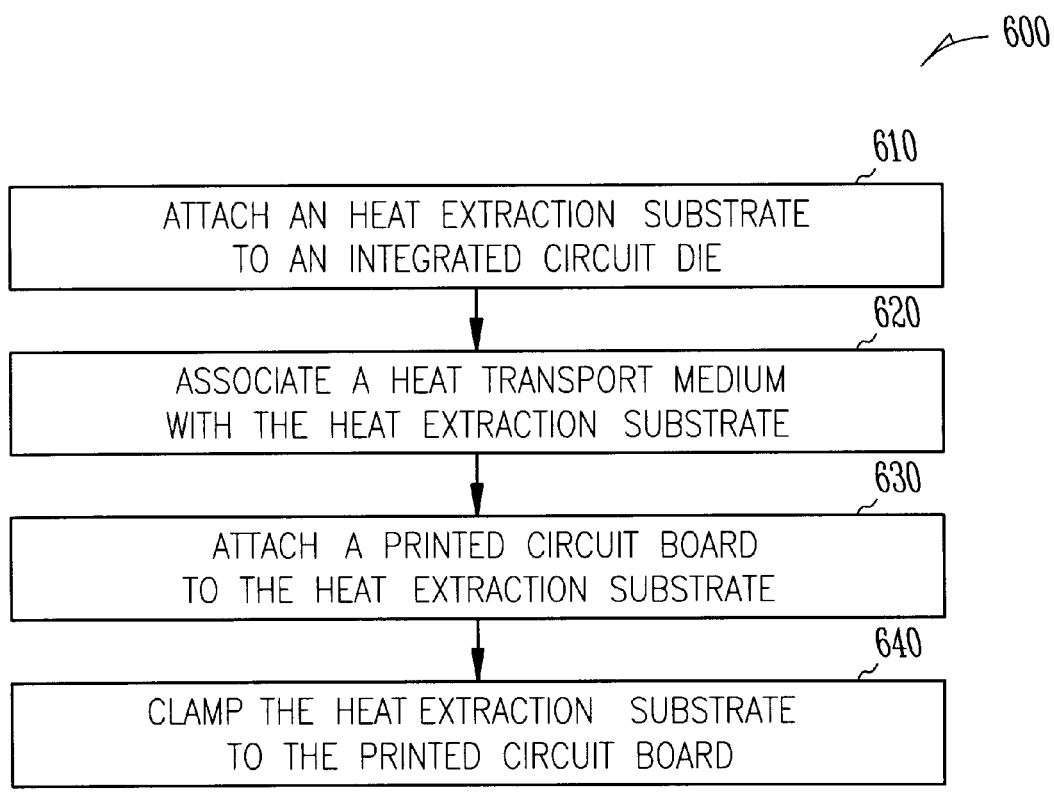
FIG. 6 is a flow diagram of one exemplary method of dissipating heat from an integrated circuit die according to an embodiment of the present invention.

FIG. 6 is a flow diagram illustrating generally a method 600 of dissipating heat generated by an integrated circuit die. Method 600, as shown in FIG. 6, begins with action 610 by attaching a heat extraction substrate to an integrated circuit die. In one embodiment, the heat extraction substrate is attached to a front side of the integrated circuit die, wherein the front side includes the integrated circuitry and external pin connections. In another embodiment, the integrated circuit die is thermally coupled to the heat extraction substrate using a thermally conductive interface material. In this embodiment, the heat extraction substrate is made from OLGA material, which is capable of extracting heat away from the attached integrated circuit die.

The next action 620 in the method 600 can include associating a heat transport medium with the heat extraction substrate to dissipate the extracted heat from the heat extraction substrate to ambient. For example, the heat transport medium can be a liquid, a thermo-siphon, a direct impingment cooling medium, a heat sink and/or one or more heat pipes. In this embodiment, two heat pipes are attached to the heat extraction substrate to transport the heat from the heat extraction substrate to ambient. The two heat pipes are thermally coupled to the heat extraction substrate using a thermally conductive interface material such as a thermally conductive adhesive, a thermal grease, a phase change metallic filled polymeric material, an elastomer, a gel, a metallic foil, a metallic paste and/or a solder. In this example embodiment, a heat sink is attached to the two heat pipes to further facilitate the dissipation of the transported heat from the heat transport medium to ambient.

The next action 630 can include attaching a printed circuit board to the heat extraction substrate such that the printed circuit board is disposed across from the integrated circuit die. The printed circuit board can be a motherboard of a computer.

The next action 640 in the method 600 can include clamping the heat extraction substrate to the printed circuit board to hold the heat extraction substrate and the heat pipes in place, and also to provide a necessary compressive force to thermally couple the heat pipes and the heat extraction substrate.

CONCLUSION

The above-described method and device provide, among other things, a heat dissipation technique that does not increase a stack height of a thermal solution to dissipate heat from an integrated circuit die. This heat dissipation technique is accomplished by attaching a front side of an integrated circuit die to a heat extraction substrate capable of extracting heat away from the front side of the integrated circuit die.

This technique of dissipating heat from the front side of the integrated circuit die provides for an added capacity (to the existing techniques of dissipating heat by attaching a heat sink to a back side of the integrated circuit die) to remove heat from the integrated circuit die, without having to increase the stack height of the thermal solution. Also this technique of dissipating the heat from the front side of the integrated circuit die eliminates the need to further handle the integrated circuit die after attaching the integrated circuit die to a substrate, thereby significantly reducing the chances of mechanically damaging the integrated circuit die during the assembly process.

It is to be understood that the above description is intended to be illustrative and not restrictive. Many other embodiments will be apparent to those of skill in the art, upon reviewing the above description. The scope of embodiments of the invention should, therefore, be determined with reference to the appended claims, along with the full scope of equivalents to which such claims are entitled.

What is claimed is:

1. A method, comprising:
   providing a heat extraction substrate that includes a composite of multiple layers of an organic material and of a thermally conductive material;
   attaching the heat extraction substrate to a front side of an integrated circuit die to extract heat generated by the integrated circuit die in a lateral direction and away from the integrated circuit die, wherein the lateral direction is substantially in plane with the multiple layers of thermally conductive material; and associating a heat transport medium with the heat extraction substrate to dissipate the laterally extracted heat away from the heat extraction substrate to ambient.

2. The method of claim 1, further comprising:

attaching a heat sink to the heat transport medium to dissipate heat from the heat transport medium to ambient.

3. The method of claim 1, wherein attaching the heat extraction substrate to the front side of the integrated circuit die comprises:

thermally coupling the heat extraction substrate to the front side of the integrated circuit die using a thermally conductive interface material.

4. The method of claim 1, wherein, in associating, the heat transport medium comprises one or more heat pipes.

5. The method of claim 1, further comprising:

attaching the heat extraction substrate to a printed circuit board such that the printed circuit board is disposed across from the integrated circuit die.

6. The method of claim 5, further comprising:

clamping the heat transport medium to the printed circuit board to provide a compressive force to thermally couple the heat transport medium to the heat extraction substrate.

7. The method of claim 1, wherein, in attaching, the integrated circuit die is a microprocessor.

8. A method, comprising:

attaching a heat extraction substrate to a front side of an integrated circuit die to extract heat generated by the integrated circuit die in a lateral direction and away from the integrated circuit die, wherein the front side of the integrated circuit die includes integrated circuitry and electrical pin connections, wherein the heat extraction substrate includes a composite of multiple layers of organic material and thermally conductive material capable of laterally extracting heat from the integrated circuit die, wherein the lateral direction is substantially in plane with the layers of thermally conductive material;

attaching a heat transport medium to the heat extraction substrate to transport the laterally extracted heat away from the heat extraction substrate; and attaching a heat sink to the heat transport medium to dissipate the heat from the heat transport medium.

9. The method of claim 8, further comprising:

attaching the heat extraction substrate to a printed circuit board such that the printed circuit board is disposed across from the integrated circuit die.

10. The method of claim 9, further comprising:

clamping the heat transport medium to the printed circuit board to provide a compressive force to thermally couple the heat transport medium to the heat extraction substrate.

11. The method of claim 10, wherein the method further comprises:

attaching the printed circuit board to the heat extraction substrate.

12. The method of claim 8, wherein attaching the heat extraction substrate to the front side of the integrated circuit die comprises:

thermally coupling the heat extraction substrate to the front side of the integrated circuit die using a thermally conductive interface material.

13. The method of claim 8, wherein, in attaching the heat extraction substrate to a front side of the integrated circuit die, the integrated circuit die is a microprocessor.

14. A method, comprising:

attaching a heat extraction substrate made of a composite of multiple layers of organic material and thermally conductive material onto a front side of an integrated circuit die such that heat generated by the integrated circuit die is extracted laterally and substantially in plane with the layers of thermally conductive material;

attaching a heat transport medium to the heat extraction substrate to transport the laterally extracted heat away from the heat extraction substrate to ambient; and attaching a heat sink to the heat transport medium to dissipate heat to ambient from the heat transport medium.

15. The method of claim 14, wherein, in attaching the heat extraction substrate onto the front side of the integrated circuit die, the thermally conductive material comprises:

one or more thin layers of copper material.

16. The method of claim 14, further comprising:

attaching the heat extraction substrate to a printed circuit board such that the printed circuit board is disposed across from the integrated circuit die.

17. The method of claim 16, further comprising:

clamping the heat transport medium to the printed circuit board to provide a compressive force to thermally couple the heat transport medium to the heat extraction substrate.

18. The method of claim 14, wherein attaching the heat extraction substrate onto the front side of the integrated circuit die comprises:

thermally coupling the heat extraction substrate to the front side of the integrated circuit die using a thermally conductive interface material.

19. The method of claim 14, in attaching the heat extraction substrate onto the front side of the integrated circuit die, the integrated circuit die is a microprocessor.

* * * * *

UNITED STATES PATENT AND TRADEMARK OFFICE
CERTIFICATE OF CORRECTION

PATENT NO. : 6,751,837 B2  
DATED : June 22, 2004  
INVENTOR(S) : Prasher

It is certified that error appears in the above-identified patent and that said Letters Patent is hereby corrected as shown below:

Title page, Item [54] and Column 1, line 1,  
Title, delete "METHOD" and insert -- METHODS --, therefor.

Column 8,  
Line 49, after "claim 14," insert -- wherein, --.

Signed and Sealed this

Nineteenth Day of October, 2004

JON W. DUDAS  
*Director of the United States Patent and Trademark Office*